US00RE35242E

United States Patent [19]

Kajimoto et al.

[11] E Patent Number: Re. 35,242

[45] Reissued Date of Patent: May 21, 1996

[54] METHOD FOR GROWING SILICON SINGLE CRYSTAL

[75] Inventors: Tsutomu Kajimoto; Daizou Horie; Shin-ichi Sakurada, all of Amagasaki, Japan

[73] Assignee: Sumitomo Sitix Corporation, Amagasaki, Japan

[21] Appl. No.: 953,630

[22] Filed: Sep. 30, 1992

Related U.S. Patent Documents

Reissue of:

[64] Patent No.: 5,037,503
Issued: Aug. 6, 1991
Appl. No.: 357,717
Filed: May 26, 1989

[30] Foreign Application Priority Data

May 31, 1988 [JP] Japan ..... 63-135147

[51] Int. Cl.[6] ..... C30B 29/06; C30B 15/20; C01B 33/02

[52] U.S. Cl. ..... 117/31; 117/33; 117/932; 423/348; 423/349; 423/350

[58] Field of Search ..... 156/617.1, 620.2, 156/620.3, 620.4, 605, 607, DIG. 64, DIG. 115; 422/245, 248, 249; 423/348, 349, 350; 117/31, 33, 932

[56] References Cited

U.S. PATENT DOCUMENTS

| | | | |
|---|---|---|---|
| 4,207,360 | 6/1980 | Padovani | 427/213 |
| 4,314,525 | 2/1982 | Hsu et al. | 423/349 |
| 4,318,942 | 3/1982 | Woerner et al. | 423/349 |
| 4,416,913 | 11/1983 | Ingle et al. | 423/350 |
| 4,656,021 | 4/1987 | Tanabe et al. | 423/350 |
| 4,668,493 | 5/1987 | Levin | 156/DIG. 64 |
| 4,684,513 | 8/1987 | Iya et al. | 423/349 |
| 4,737,348 | 4/1988 | Levin | 423/380 |
| 4,751,067 | 6/1988 | Levin | 156/DIG. 64 |
| 4,868,013 | 9/1989 | Allen | 423/350 |
| 4,900,411 | 2/1990 | Poong et al. | 423/349 |

*Primary Examiner*—Gary P. Straub
*Attorney, Agent, or Firm*—Burns, Doane, Swecker & Mathis

[57] ABSTRACT

A method for growing silicon single crystal uses as materials, silicon granules prepared by the silane process and having a residual hydrogen concentration of 7.5 wtppm or less, silicon granules prepared by the trichlorosilane process and having a residual chlorine concentration of 15 wtppm or less. In the case where such silicon granules are used, a bursting phenomenon does not occur when the silicon granules are melted. As a result, there is no scattered matter due to the bursting phenomenon, whereby the growth condition of the single crystal is not disturbed.

16 Claims, 10 Drawing Sheets

○ SILICON
● HYDROGEN

METHOD FOR GROWING SILICON SINGLE CRYSTAL

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to a method for growing a silicon single crystal using silicon granules.

2. Description of Related Art

As a method for growing a silicon single crystal, the Czochralski method is well known, wherein silicon raw materials are put in a crucible made of quartz and are melted, then a silicon seed crystal is soaked into the liquid silicon and is pulled up while being rotated, thereby growing silicon single crystal at the lower end of the seed crystal.

As silicon raw materials to be put in the crucible in the first place, lumps of shattered poly crystal are often used. In consideration of the decrease of volume with the melting, at first, lumps of the material are heaped in the crucible. As the melting proceeds, lumps of the material become engaged in the form of a bridge. Accordingly, there is a problem in that the bridge collapses to scatter the liquid silicon, or the quartz is warped.

In order to solve the difficulties mentioned above, silicon granules are used as silicon raw materials (to be described as the initial charge silicon materials) to be put in the crucible in the first place. In the case where the silicon granules are used as the initial charge silicon materials, the difficulties described above are solved. Moreover, since the rate of filling can be made larger as compared with that of the lump material, cost per chip can be reduced. It also is easily dealt with, for its volume is smaller compared with that of the lump material.

When the silicon materials put in the crucible are melted, the volume is decreased. In order to make the best use of cubic contents of the crucible, additional silicon materials (to be described as charge up silicon materials) are supplied into the crucible and melted. As the methods for supplying charge up silicon materials, a method for supplying and melting cylinder shape silicon materials (Japanese Utility Model Application Publication No. 50-11788, 1975) or a method for supplying and melting lump silicon materials by using a special tool (Japanese Patent Application Laid-Open No. 50-11788, 1975) is well known.

In the case where the cylinder shape silicon materials are used, there are difficulties in that the crucible is broken down and the liquid silicon is leaked when too much of the materials are put in and in that the liquid silicon is boiled when the materials and the liquid silicon are left alone separately. Also, in the case where the lump silicon materials are used, since the liquid silicon is scattered when the materials are supplied into the liquid silicon, the surface of the liquid silicon is temporarily solidified and after that, the materials are supplied. But there is a in that the crucible is broken down and the liquid silicon is leaked during solidification.

In order to solve the difficulties described above, sometimes silicon granules are used as charge up silicon materials. In the case where silicon granules are used for the purpose, this difficulties described above are solved.

In order to grow the silicon single crystal successively while a seed crystal is pulled up, it is necessary to supply the silicon materials into the crucible corresponding to the growth volume of the single crystal, since the crucible volume has its own limit. Also the supply of the silicon materials (to be described as additional charge silicon materials) must be carried so as not to change the growth condition.

For this reason, in the conventional example, by providing inside of the crucible another crucible or a cylinder having an opening for flowing the liquid silicon, the surface of the liquid silicon can be divided into two regions including an inner region for pulling up the single crystal and an outer region for supplying silicon materials (Japanese Patent Application Laid-Open No. 57-183392, 1982 and No. 47-10355, 1972). These methods intend to reduce as much as possible the effect of wave motion, dust, temperature change and so on of the surface of the liquid silicon, accompanying the supply of the materials, exerted upon the inner region as the crystal growth region. Also as the additional charge silicon materials, lump shaped silicon materials which are the broken poly crystals silicon are widely used.

Since the shape of the lump silicon materials described above is not fixed, there is a difficulty in that the material supplying portion is easy to get clogged as the materials become engaged in the state of a bridge. Hereupon, in order to solve the difficulty, sometimes silicon granules are used as additional charge silicon materials.

In the case where the silicon granules are used for initial charge and charge up, however, there is a problem in that scattered matter accumulates on the surface of the crucible due to the explosion phenomenon which occurs when the silicon materials are heated up to immediately before the melting temperature, and the accumulated matter drops on the surface of the liquid silicon, disturbing the crystal growth condition to produce faulty crystal.

Furthermore in the case where the silicon granules are used as additional charge, materials scattered matter drops into the inner region (the single crystal growth region) or onto the crystal growth surface due to the same explosion, disturbing the crystal growth condition to induce faulty crystal.

SUMMARY OF THE INVENTION

FIGS. 1(a), 1(b), 1(c) are explanatory views of the bursting phenomenon of silicon granules prepared by the silane process, which the inventors learned as a result of experiment and investigation. In the silane process, as shown in FIG. 1(a), granules successively grow up as a result of combination a silicon on the surfaces thereof with silicon in gas surrounding them. In this process of growth, however, hydrogen (H) also combines with silicon, thereby H is taken in a granule, and on the surface of the granule, undissociated hydrogen is absorbed in a form of Si—H or H—Si—H.

In such a process of growth of a granule, a granule combines with any other granule. As shown in FIG. 1(b), in a gap among combined granules A, B and C, undissociated hydrogen atoms which are absorbed on the surface of granules are in the state of being confined. When such a material is heated, as shown in FIG. 1(c), undissociated hydrogen atoms on the surface of the granules or confined inside of the granules are released as hydrogen gas ($H_2$). When the material is in such a state just prior to melting and when a coupling force between granules is reduced as a result, it is considered that the granule explodes into pieces of granules due to the rapid expansion of hydrogen gas and that they enter onto the inner region of the crucible or into single crystal growth surface as scattered matter.

The inventors learned that the bursting phenomenon of the material itself caused in silicon granules just prior to its melting, is closely related to the hydrogen concentration (to be described [H]) in the silicon granules prepared by the silane process, and that the bursting phenomenon remarkably declines when [H] is below a prescribed value. The inventors also leaned that the chlorine concentration (to be described [CL]) in the silicon granules prepared by the trichlorosilane process has the same effect as [H].

In the method for growing silicon single crystal of the present invention, silicon single crystal is grown by using silicon granules prepared by the silane process, wherein [H] is 7.5 wtppm or less, or silicon granules prepared the trichlorosilane process, wherein [CL]) is 15 wtppm or less. Briefly, silicon granules having [H] or [CL] as described above can be used for any, or two, or all of initial charge silicon materials, and charge up silicon materials, additional charge silicon materials.

A primary object of the present invention is to provide a method for growing silicon single crystal capable of solving difficulties which occur when using cylinder shape or lump shape silicon materials, by using silicon granules.

The more specific object of the present invention is to provide a method for growing silicon single crystal capable of repressing the bursting phenomenon by controlling [H] or [CL] to be the value above mentioned.

Another object of the present invention is to provide a method for growing silicon single crystal capable of preventing the scattered matter from dropping down on the surface of the liquid silicon, and preventing the crystal growth condition from being disturbed.

Still another object of the present invention is to provide a method for growing silicon single crystal capable of producing normal silicon single crystal.

A further object of the present invention is to provide a method for growing silicon single crystal capable of reducing [H], by heating silicon granules in the atmosphere of an inert gas.

A still further object of the present invention is to provide a method for growing silicon single crystal capable of reducing [CL], by quickening the deposition speed of silicon granules prepared by the trichlorosilane process.

Another object of the present invention is to provide a method for growing silicon single crystal capable of reducing a bad effect upon growth condition by supplying additional charge silicon materials into a crucible from several positions, thereby reducing the degree of temperature drop of the liquid silicon.

The above and further objects and features of the invention will more fully be apparent from the following detailed description and accompanying drawings.

DESCRIPTION OF THE PREFERRED EMBODIMENTS

Figure 1A:
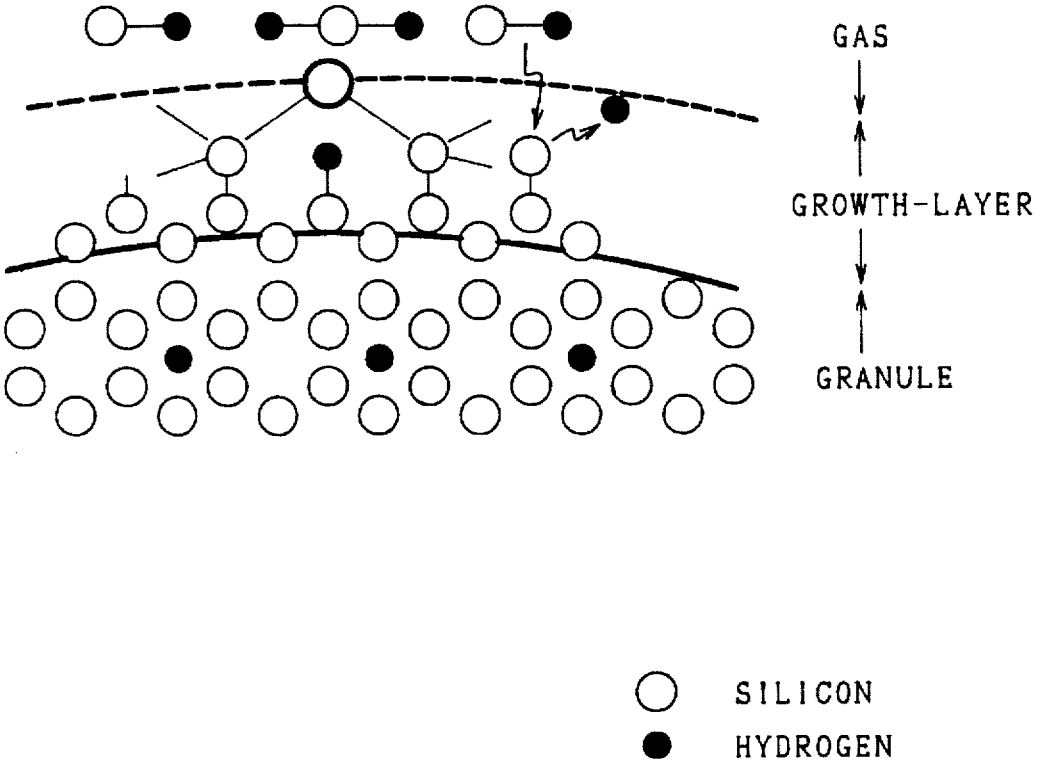
FIGS. 1(a), 1(b) and 1(c) is an explanatory view of the bursting phenomenon of silicon granules prepared by the silane process.
Figure 1B:
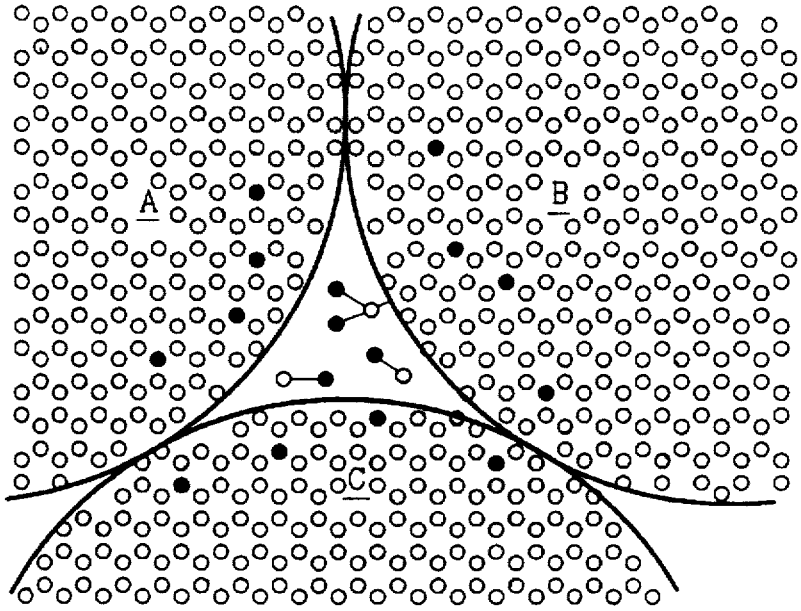
Figure 1C:
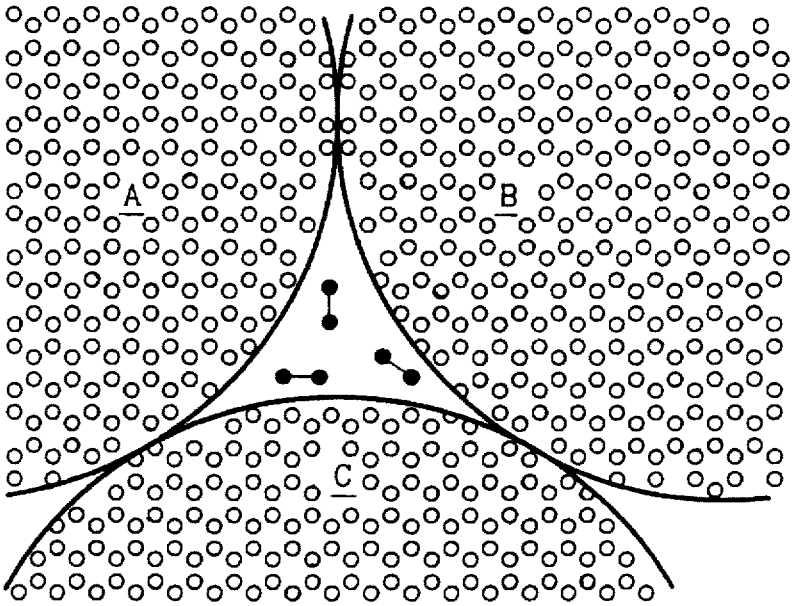
Figure 2:
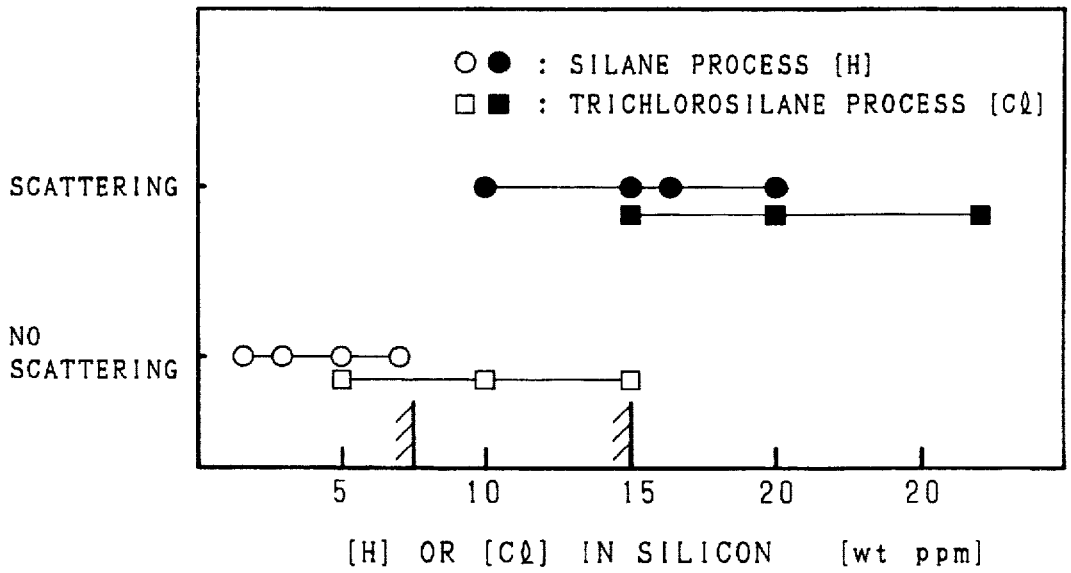
FIG. 2 is a graph showing a relationship between hydrogen concentration ([H]) or chlorine concentration ([Cl]) in silicon granules and the presence of scattering.

FIG. 2 is a graph showing the relationship between [H] or [Cl] in silicon granules material and the presence of scattering when silicon single crystal is produced. In the graph, the abscissas as shows [H] (by fusion gas-chromatography) and [Cl] (by neutron activation analysis) and the ordinates axis shows the presence of scattering. In the graph, ○ and □ shows no scattering, and symbols and show scattering, respectively. As is obvious from the graph, in the case where [H] is 7.5 wtppm or less or [Cl] is 15 wtppm or less, there is no scattering in the growing process, thereby it is possible to produce normal silicon single crystal.

Incidentally, in the case where silicon granules are prepared by the silane process, silane gas $SiH_4$ is decomposed at the temperature 600°~800° C. on the surface of powdered silicon seeds introduced in a bell jar and the powdered seeds grow into granules. The prepared silicon granule has a structure in which fine single crystal particles gather, and usually undissociated hydrogen (H) is taken in to the degree of 20~40 wtppm in the single crystal particles. Accordingly, a disposal treatment must be carried out to reduce [H] to be 7.5 wtppm or less.

Figure 3:
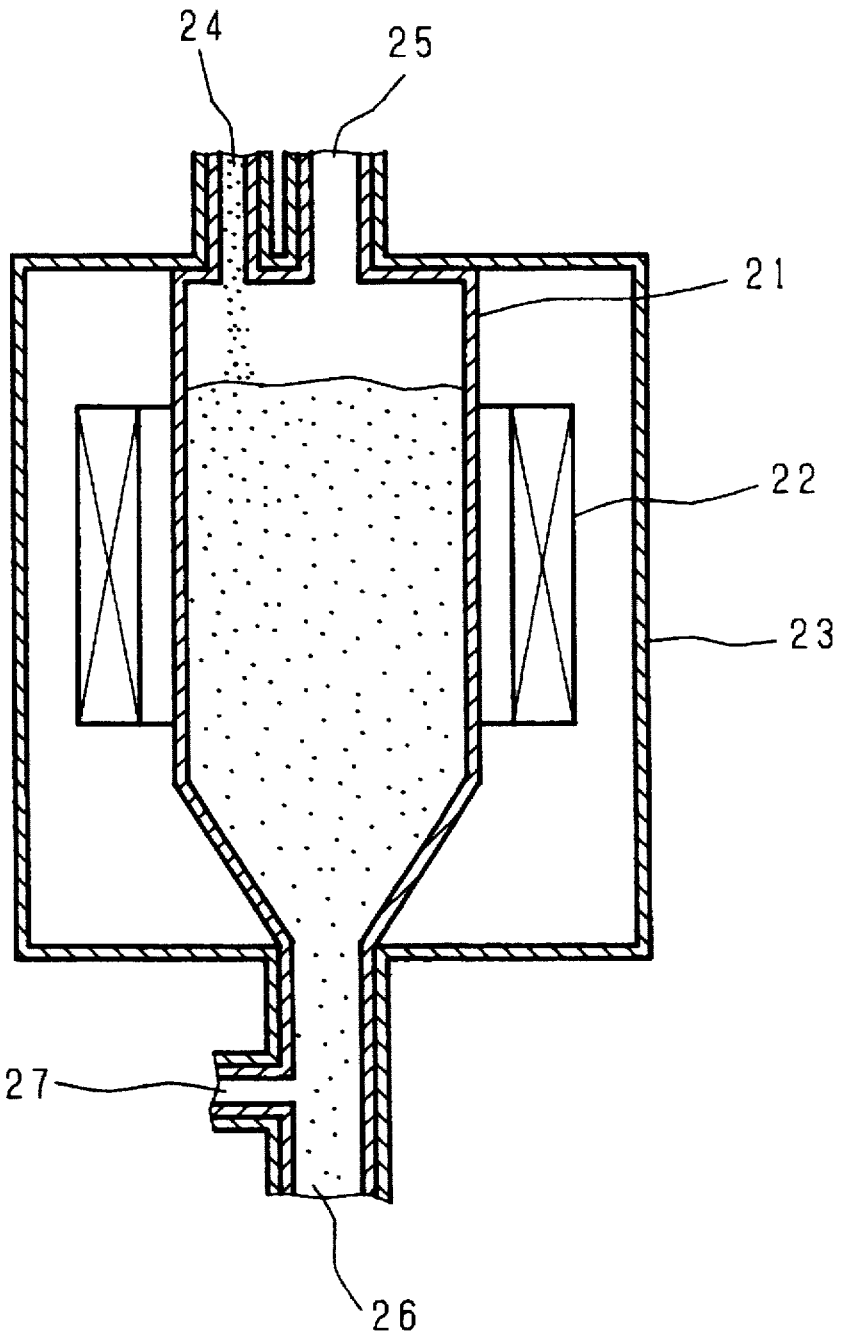
FIG. 3 is a sectional view of an apparatus for reducing the residual hydrogen concentration in silicon granules.

FIG. 3 is a longitudinal sectional view of an apparatus for carrying out the treament. In the figure, reference numeral 21 indicates a heating container made of carbon graphite. Around the heating container 21, a heater 22 is provided. The heating container 21, provided with the heater 22 is housed in a housing 23 made of metal. At one end portion of the heating container 21, in the state that the upper surface of the housing 23 is penetrated, a particle inlet pipe 24 and a gas effluent (outlet) pipe 25 are placed side by side and are connected with the heating container 21, respectively. At the other end portion of the heating container 21, in the state that the lower surface of the housing 23 is penetrated, a particle extracting outlet pipe 26 is connected with the heating container 21. At the halfway of the particle extracting pipe 26, a gas affluent pipe 27 is connected therewith.

In an apparatus of such a structure, silicon granules (diameter: 0.015~0.30 cm) prepared by the silane process are passed into the heating container 21 through the particle inlet pipe 24 and an inert gas such as argon gas is introduced into the heating container 21 through the gas inlet pipe 27, while silicon granules in the heating container are heated by the heater 22. Then hydrogen included in the silicon granules is thermodiffused or evaporated, and exhausted to the outside through the gas outlet pipe 25 together with the introduced inert gas. After that, the silicon granules which have been reduced in [H] are taken out through the particle extracting pipe 26.

In the case where [H] is reduced by the apparatus above mentioned, when [H] at the center of a granule (assuming the granule to be spherical with a diameter $d_p$) is reduced to the extent of 13/100 of a granule passed into the heating container 21, for example, heat treatment should be carried out so as to certify the following equation (1).

$$\frac{D(T)\cdot t}{d_p^2} \geqq 0.07 \quad (1)$$

wherein,

D(T): diffusion coefficient of hydrogen atom t: heating time [s]

T: heating temperature [K]

Figure 4:
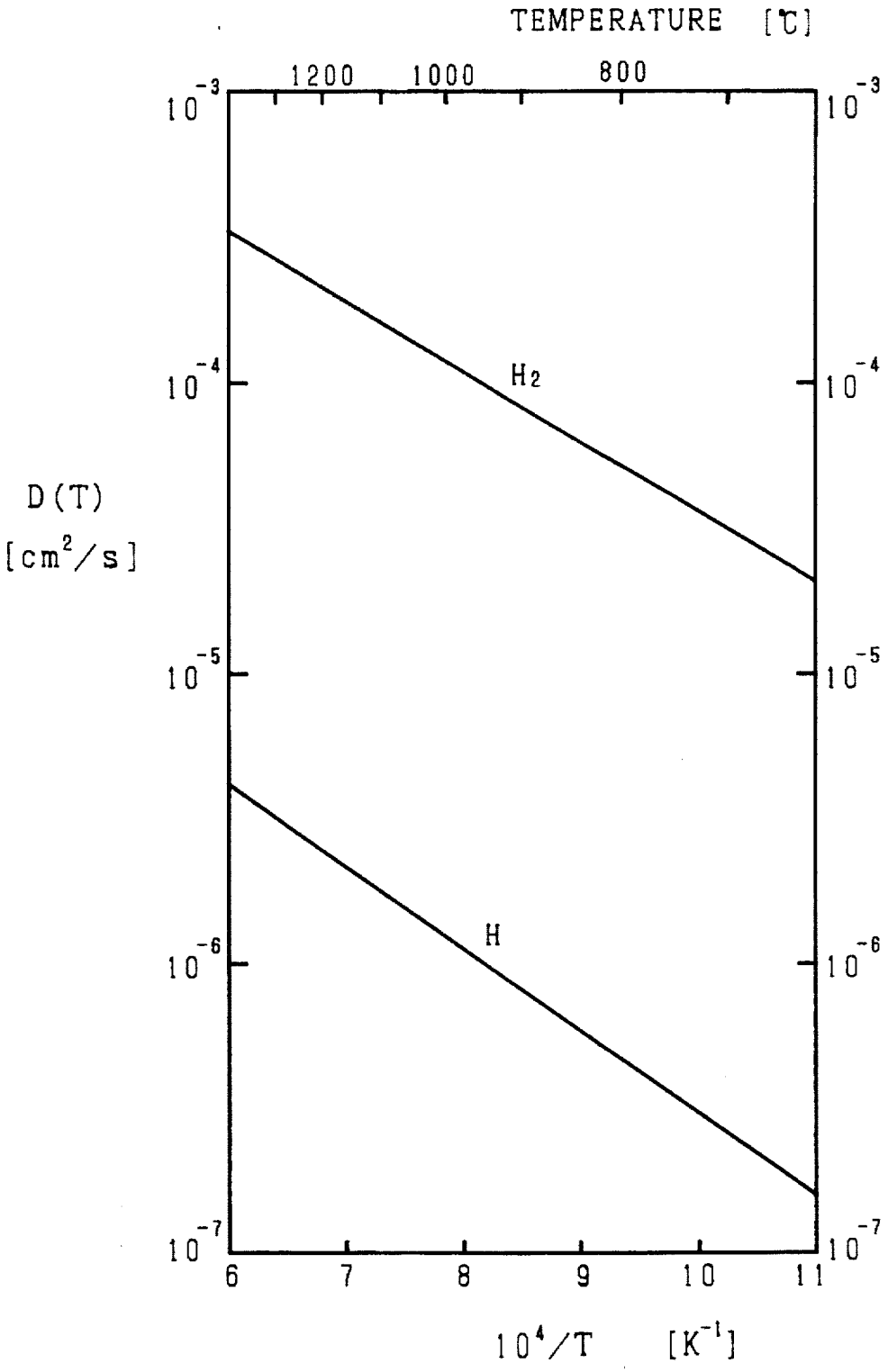
FIG. 4 is a graph showing a diffusion coefficient of hydrogen versus temperature change in a silicon granule.

By observation, in the case where the heating temperature is within a limit of 700°~1100° C., an equation $D(T)=2.1\times 10^{-4}\exp(-0.564\ e.v./kT)$ [$cm^2/s$] is satisfied.

wherein k: Boltzmann constant,

In addition, the diffusion coefficient D(T) accompanying temperature change is shown in FIG. 4. The diffusion coefficient of the hydrogen molecule $D(T)=9.4\times10^{-3}\exp(-0.48\ e.v./kT)$ [$cm^2/s$] is also shown in FIG. 4.

Figure 5:
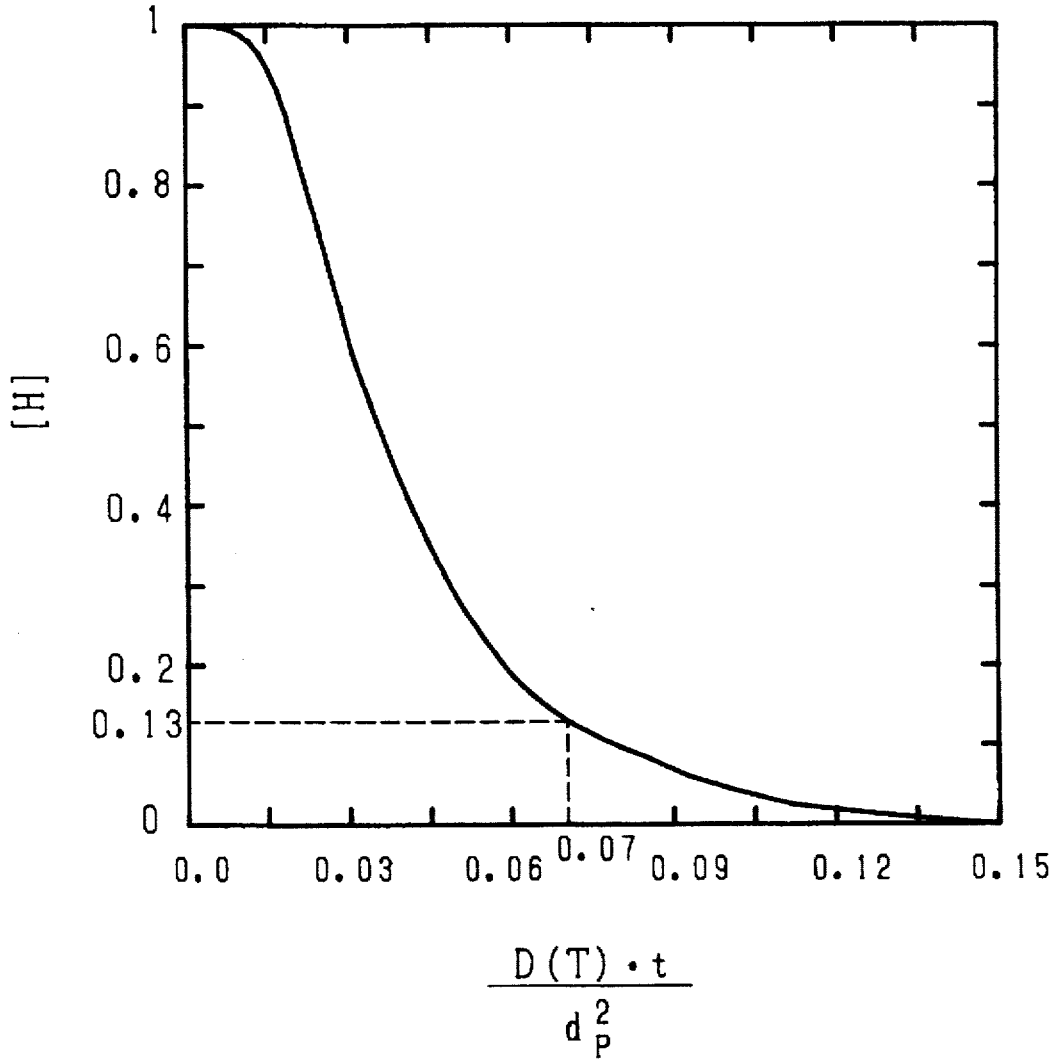
FIG. 5 is a graph showing the [H] change of a center of a silicon granule as time passes when the silicon granule is heated.

FIG. 5 is a graph showing the relationship between the left side of the equation (1) aforementioned (the abcissa axis) and [H] at the center of a granule (provided that initial value=1, the ordinate axis). As shown in FIG. 5 A broken line, when the value of the left side of the equation (1) is set to be 0.07, for example [H] can be reduced to the extent of 0.13 times its original concentration. Furthermore, at the peripheral portion of a granule, the rate of reduction of [H] is rapid compared with that at the center, and when the value of the left side of the equation (1) is set to be 0.07, [H] at the peripheral portion of a granule is almost 0.

Figure 6:
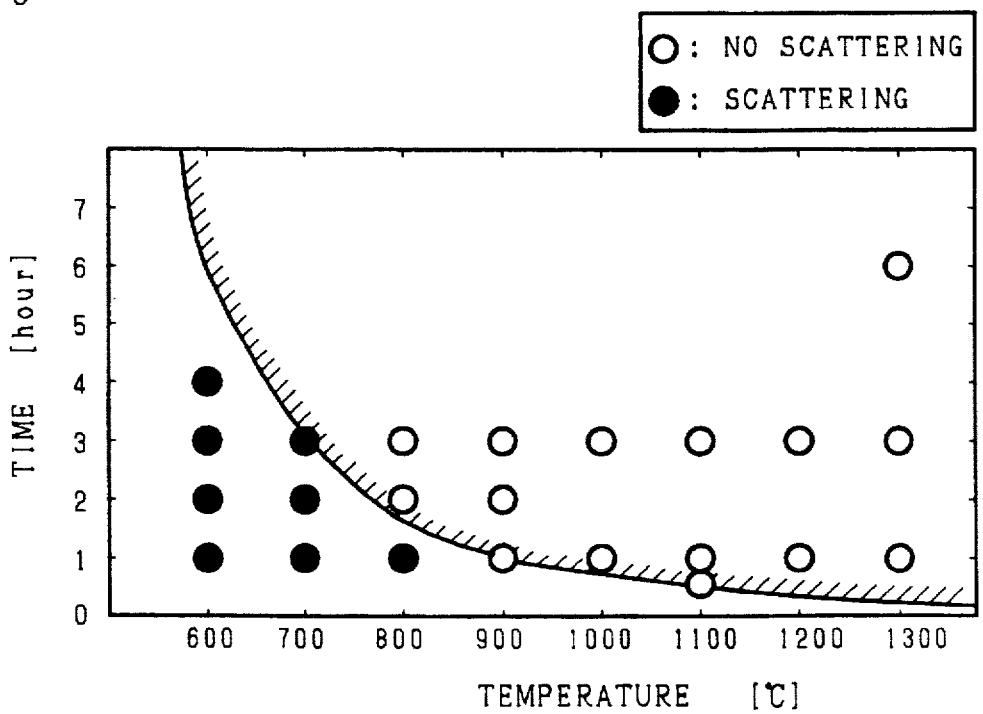
FIG. 6 is a graph showing the effect which heat treatment temperature and treatment time exert on scattering.

FIG. 6 is a graph showing a result of an experiment about an effect be scattering, exerted by heating temperature and heating time for silicon granules, the abcissa axis and the ordinate axis showing the heating temperature and the heating time, respectively. The curve in the graph shows the case where the value of the left side of the equation (1) is 0.07. And the symbols ○ and show no scattering and scattering respectively.

As is obvious from the graph, when the heat treatment is carried out within the limits of the region affixed with hatching with the threshold curve as the borderline, [H] is reduced to 7.5 wtppm or less, thereby silicon granules with no scattering can be obtained.

On the other hand, in the case where silicon granules are prepared by the trichlorosilane process, trichlorosilane gas is introduced on the surface of powdered silicon seeds introduced in a bell jar, and the powdered seeds grow into granules by means of reduction at the temperature of 1000°~1200° C.

As the chlorine (Cl) taken in produced granules is hard to diffuse compared with hydrogen (H), [Cl] is not reduced even when the heating treatment aforementioned is carried out. Accordingly, in order to reduce [Cl], it is necessary to reduce [Cl] when granules are produced.

Figure 7:
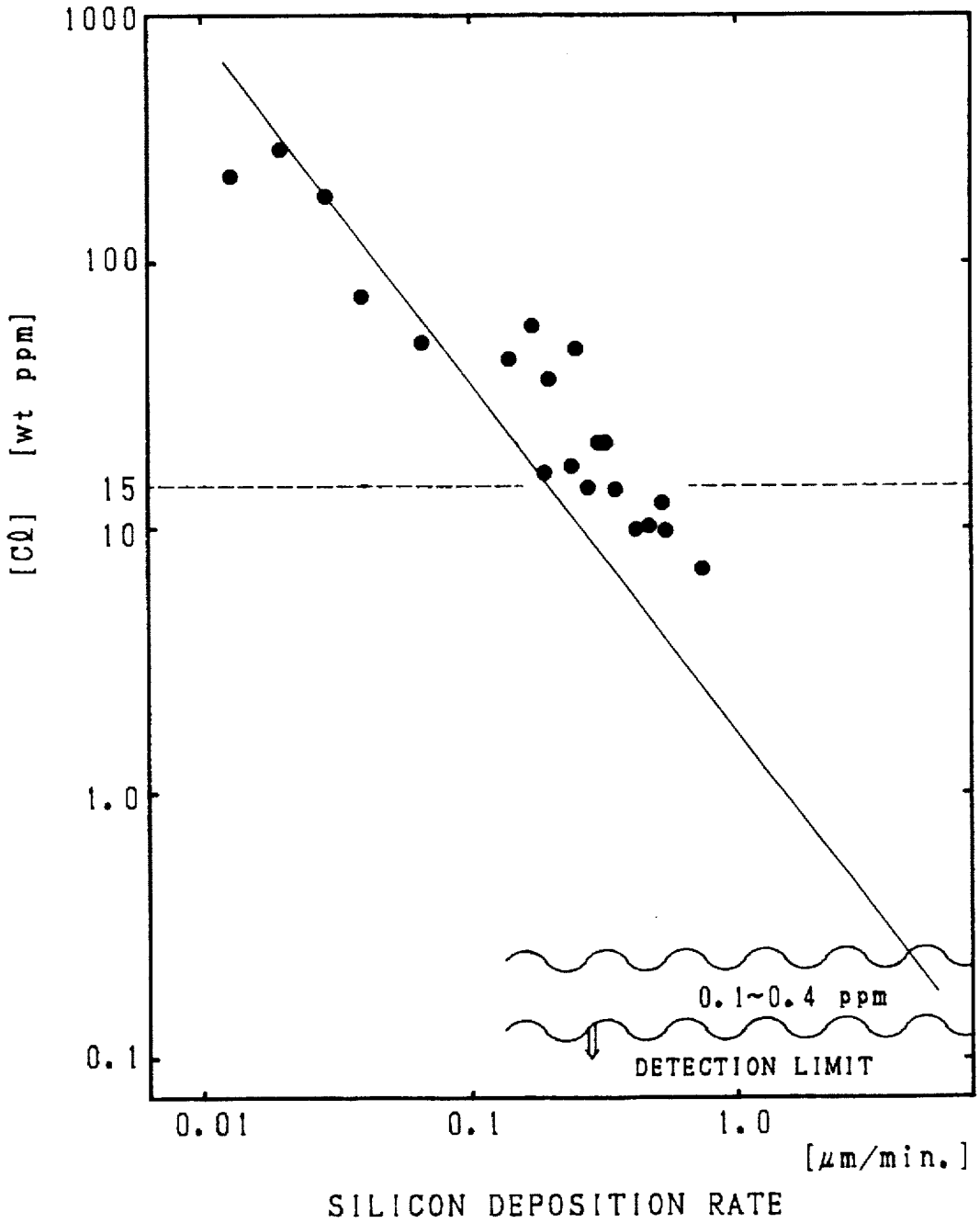
FIG. 7 is a graph showing a relationship between the deposition speed of silicon granules and residual chlorine concentration.

The relationship between the deposition rate of silicon granules and [Cl] a growth experiment using trichlorosilane process, carried out by the inventors is shown in FIG. 7. In addition, the experiment conditions are as follows;

reacting apparatus: a similar apparatus to the one shown in FIG. 3 reaction temperature: 900°~1100° C.

trichlorosilane / $H_2$ (molar ratio): 0.05~2 total pressure: 1 atm height of fluidized bed: 30~180 cm diameter of a particle: 0.05~0.2 cm.

The straight line in FIG. 7 shows a tendency of correlation between the silicon desposition rate and the [Cl] contents FIG. 7 shows a strong correlation between both of these parameters. The larger the deposition rate of silicon is, the more [Cl] is reduced. In this growth condition, [Cl can be reduced to 15 wtppm or less by making the deposition rate of silicon to be 0.4 μm/min. or more.

As above mentioned, silicon granules related to the method of the present invention can be obtained.

Next, an example of a concrete apparatus is shown in the case where single crystal growth is carried out by using silicon granules related to the invention (silicon granules in which [H] is reduced to 7.5 wtppm or less or silicon granules in which [Cl] is reduced to 15 wtppm or less).

Figure 8:
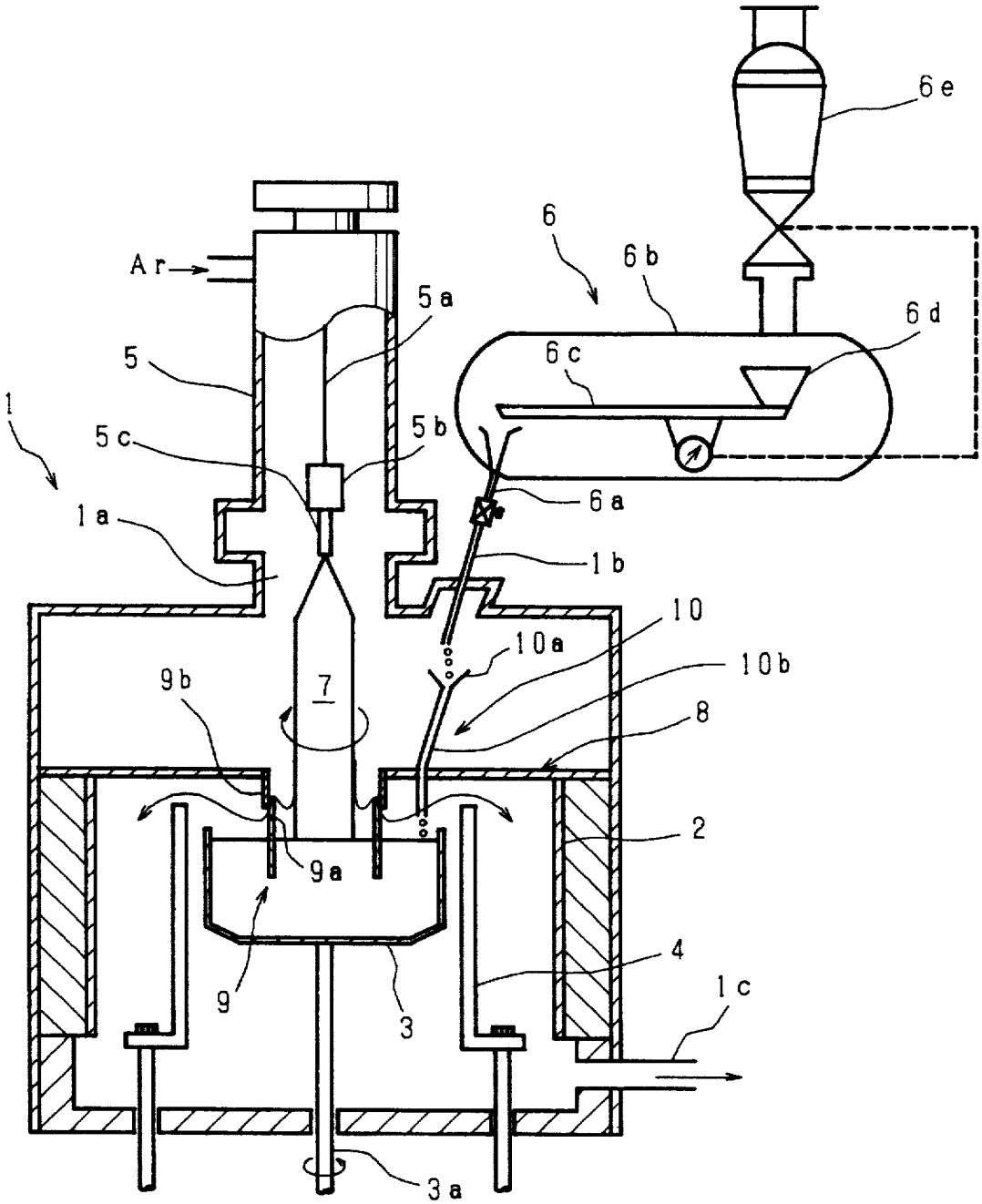
FIGS. 8 and 10 are sectional views showing an apparatus for carrying out a method for growing silicon single crystal of the present invention.

FIG. 8 is a sectional view of a first embodiment of an apparatus for carrying out the single crystal growth of the invention, wherein reference numeral 1 designates a chamber, 2 designates a heat reserving wall, 3 designates a crucible, and 4 designates a heater. At the inner surface of the chamber 1, the heat reserving wall 2 is lined. The crucible 3 is provided the center portion of the chamber 1 surrounded by the heat reserving wall 2. The heater 4 is provided between the crucible 3 and the heat reserving wall 2 in the state of forming an air passage with the proper gap between them.

The crucible 3 has a double construction in which a container made of quartz is set in a container made of graphite. At the central portion of the bottom of the crucible 3, an upper end of an axle 3a which passes through the bottom wall of the chamber 1 is connected, and the crucible 3 is lifted up and down by the axle 3a, while being rotated.

At the center of the upper wall of the chamber 1, a lift opening 1a for single crystal pulling also serves as a supply opening for ambient atmosphere gas, and a material supply opening 1b is opened at a portion around the lift opening 1a. At the lift opening 1a, a guard cylinder 5 is installed, and a material supply pipe 6a of a material supply apparatus 6 is inserted into the chamber 1 through the material supply opening 1b.

From the upper end of the guard cylinder 5, a chuck 5b for seizing a seed crystal 5c with the use of a lift axis 5a is hung down, and the upper end of the lift axis 5a is connected with a rotation and up-and-down mechanism (not shown). After the seed crystal 5c is brought into contact with into the liquid silicon inside of the crucible 3, silicon single crystal is grown at the lower end of the seed crystal 5c by rotating and raising the seed crystal 5c.

Inside of the chamber 1, at the upper surface of the heat reserving wall 2, a supporting member 8 in a form of an annular ring is provided. A bulkhead member 9 is made of quartz, and consists of supporting pieces 9b provided at plurality of positions spaced-apart in the circumferential direction at an inner periphery of the supporting member 8 and a cylindrical bulkhead portion 9a is supported by the supporting pieces 9b. The lower end of the cylindrical bulkhead portion 9a is positioned at a predetermined height from the inner bottom of the crucible 3, and is brought into contact with into the liquid silicon to a predetermined depth. The cylindrical bulkhead portion 9a divides the crucible into two regions; i.e., an inner region and an outer circular region concentric with each other.

A material introducing tool 10 includes a funnel portion 10a and a pipe 10b connected therewith. The funnel portion 10a faces the lower end of the material supply pipe 6a inserted from the material supply opening 1b.

The pipe 10b passes through the supporting member 8, and the lower end of the pipe 10b is in the crucible 3, facing the outer circular region outside the cylindrical bulkhead portion 9a.

The upper end of the material supply pipe 6a is positioned below an electromagnetic feeder 6c of a weighing apparatus provided in a casing 6b at the material supply apparatus 6 provided outside the chamber 1. The end of the electromagnetic feeder 6c is provided with a sub-hopper 6d, and above the sub-hopper 6d, a main hopper 6e fixed on the casing 6b faces therewith.

Next, explanation is given on a concrete procedure of silicon single crystal growth by using an apparatus of such a construction.

At first, after silicon granules related to the present invention are put in the crucible 3 as initial charge silicon materials, the crucible 3 is heated by the heater 4, thereby melting the stored silicon granules in the crucible 3. With the melting, the volume is decreased, therefore, a proper quantity of silicon granules related to the invention is added into the crucible 3 as charge up silicon materials.

The crucible 3 is rotated by the axis 3a supporting the crucible 3 in the direction of an arrow, and the lift axis 5a forming a lift means is lowered to soak the seed crystal 5c into the liquid silicon inside the cylindrical bulkhead portion 9a. After that, the lift axis 5a is pulled up at a prescribed speed (average speed 1.5 mm/min.) while being rotated, and the silicon single crystal 7 is grown onto the lower end of the seed crystal 5c.

The silicon granules are stored in the main hopper 6e in advance as the additional charge silicon materials. And they are supplied to the outer region of the cylindrical bulkhead portion 9a in the crucible 3 through the main hopper 6e, the sub-hopper 6d, the electromagnetic feeder 6c where they are weighed, the material supply pipe 6a and through the material introducing tool 10.

In addition, from the beginning of the melting of the silicon granules stored in the first place, to the end of pulling up the single crystal, an inert gas such as argon is introduced above the crucible 3 through the guard cylinder 5 from a supply pipe connected with the upper end of the guard cylinder 5. The inert gas passing from the upper part of the guard cylinder 5 is screened by the supporting member 8, gets to the surface of the liquid silicon in the crucible 3 along the silicon single crystal 7, and is drawn out of an exhaust port 1c opened at a side wall of the lower part of the chamber 1 by an exhausting pump (not shown), through the cylindrical bulkhead portion 9a and the supporting pieces 9b, the outer region of the cylindrical bulkhead portion 9a and through an air passage formed between the heater 4 and the heat reserving wall 2.

Figure 9:
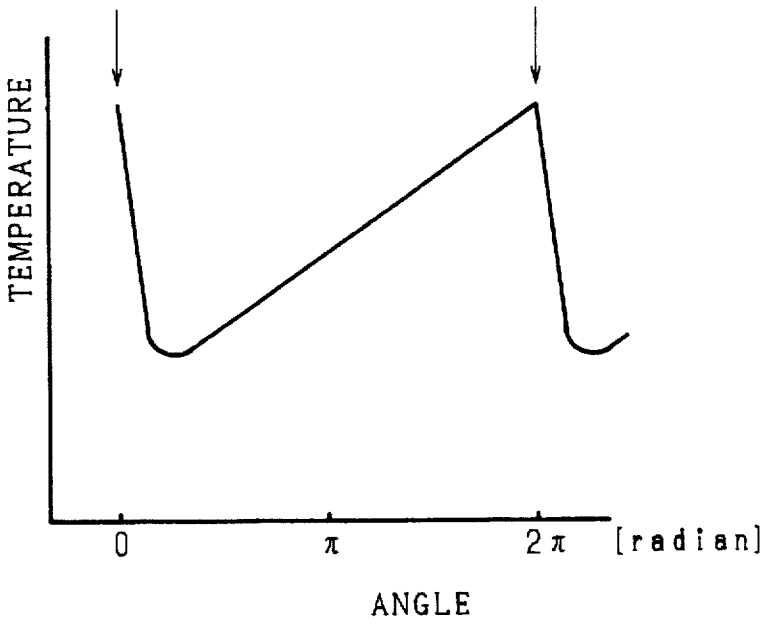
FIGS. 9 and 11 are graphs showing a relationship between phase angle of a crucible based a supply pattern of silicon granules into the crucible and temperature of liquid silicon.

In an apparatus of the embodiment, the additional charge silicon materials are supplied from one position in the circumferential direction of the crucible 3. The relationship between the phase angle and the temperature of the liquid silicon in the crucible 3 is shown in FIG. 9. In addition, arrows in the figure show the supply position of the additional charge silicon materials. As is understood from FIG. 9, in this embodiment, since the silicon materials are supplied from one position, the temperature of the liquid silicon drops remarkably only in the vicinity of the supply position. Accordingly, there is a possibility that the growth condition is disturbed in such a case.

Figure 10:
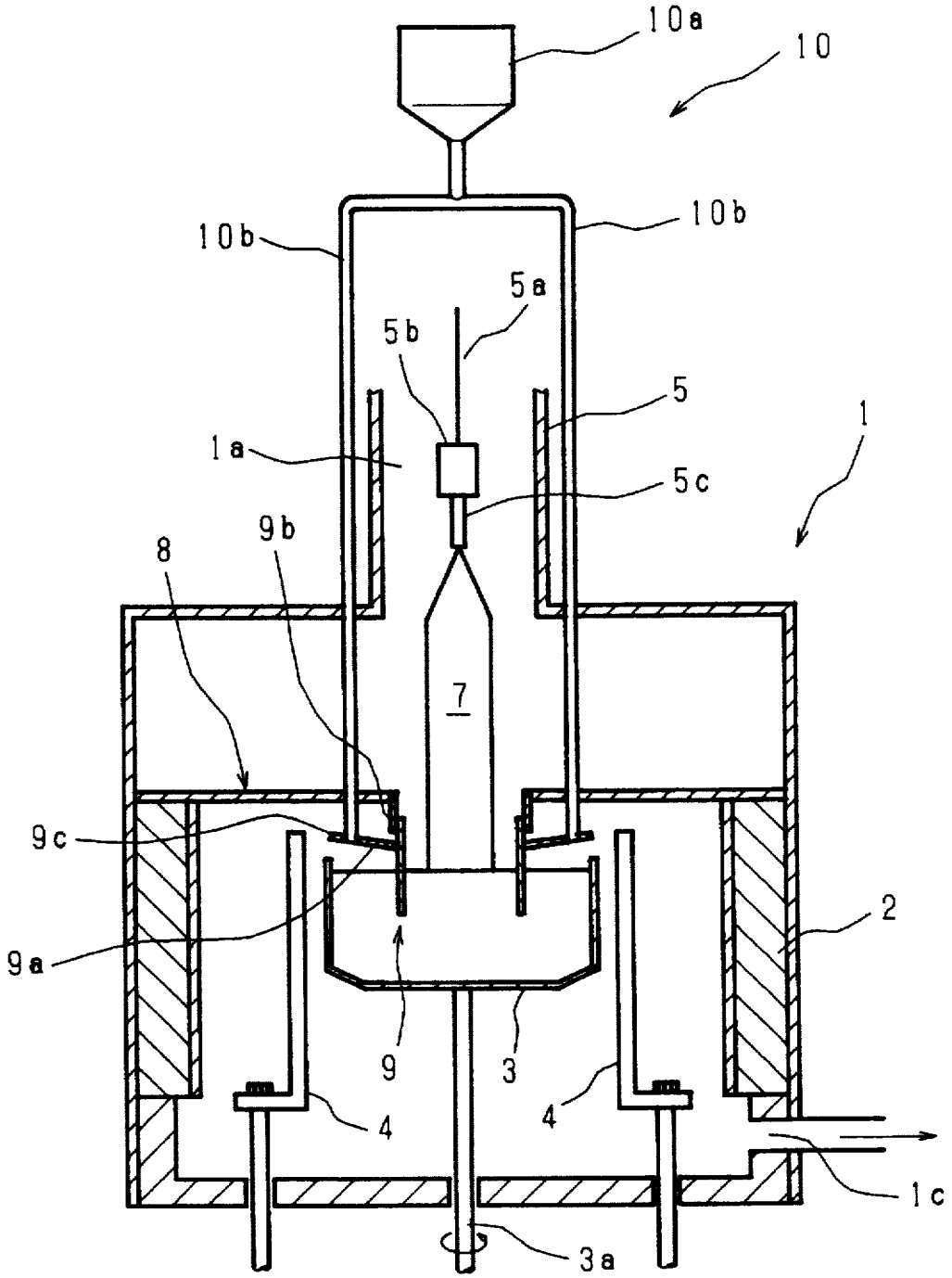

FIG. 10 shows a sectional view of a second embodiment of an apparatus for carrying out the method of the invention. In addition, the same reference numerals shown in FIG. 8 are used to show the same or corresponding parts. In this apparatus of the embodiment, the additional charge silicon materials are supplied from plural positions in the circumferential direction of the crucible 3.

The material introducing tool 10 consists of the funnel portion 10a and a plurality (four, for example) of pipes 10b connected therewith. Respective pipes 10b successively pass through the chamber 1, the supporting member 8 and a bulk-head portion 9c of the bulkhead member 9. The lower ends of the respective pipes 10b are provided at the same intervals (four lower ends, for example) in the circumferential direction as the pipes 10b and face the outer region in the crucible 3. A material supply apparatus for supplying the silicon materials to the material introducing tool 10 is not shown in the figure.

Figure 11:
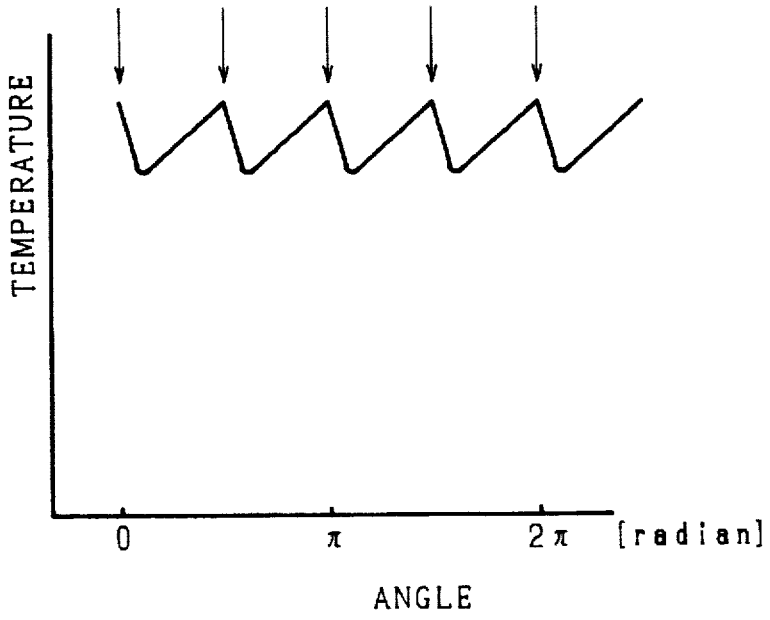

In this embodiment, the additional charge silicon materials are supplied from plural positions in the circumferential direction while the crucible is rotated. The relationship between the phase angle of the crucible 3 and the liquid silicon temperature in such a case is shown in FIG. 11. In addition, arrows in the figure show the supply position of the additional charge silicon materials (in this example, four positions at every $\pi/2$). As is understood from FIG. 11, in this embodiment, since the silicon materials are supplied from plural positions, the temperature drop of the liquid silicon in the vicinity of the supply positions is small. Accordingly, this embodiment is capable of reducing the possiblility of disturbing the single crystal growth condition in comparison with the first embodiment.

Furthermore, in the embodiment above mentioned, the silicon granules related to the invention are used as the initial charge silicon materials, the charge up silicon materials and the additional charge silicon materials, however, it goes without saying that the silicon granules related to the invention may be used as any one or any two kinds of the three uses above mentioned.

As this invention may be embodied in various forms without departing from the spirit of an scope thereof, the foregoing embodiments are therefore illustrative and not restrictive, since the scope of the invention is defined by the appended claims rather than by the foregoing description, and all changes that fall within the scope of the claims, or equivalents thereof are therefore intended to be embraced by the claims.

What is claimed is:

1. A method for producing silicon single crystal using silicon granules, comprising:

preparing powdered silicon;

growing silicon granules by decomposing silane gas on the surface of said powdered silicon;

heating said silicon granules in an atmosphere of an inert gas so as to have a residual hydrogen concentration of 7.5 wtppm or less; and growing silicon single crystal by pulling a silicon seed crystal from a melt of liquid silicon prepared by melting said silicon granules.

2. A method for producing silicon single crystal as set forth in claim 1, wherein in the step of growing silicon single crystal, said silicon granules are put in a crucible and melted, said silicon seed crystal is brought into contact with said melt of liquid silicon in said crucible, and said silicon single crystal growing at an end of with said seed crystal is pulled up together with said seed crystal.

3. A method for producing silicon single crystal as set forth in claim 1, wherein in the step of growing silicon single crystal, said silicon granules are supplied in a crucible as additional charge silicon materials.

4. A method for producing silicon single crystal as set forth in claim 3, wherein said silicon granules are supplied in said crucible as initial charge silicon materials.

5. A method for producing silicon single crystal as set forth in claim 1, wherein in the step of growing silicon single crystal, a bulkhead for dividing a crucible into an inner region and an outer region is provided in said crucible in the state that both regions communicate with each other under a surface of said liquid silicon, said silicon seed crystal is brought into contact with said liquid silicon in said inner region, said silicon granules are supplied into said outer region as additional charge silicon materials, and said silicon single crystal growing at an end of said seed crystal is pulled up together with said seed crystal.

6. A method for producing silicon single crystal as set forth in claim 5, wherein said silicon granules are supplied into said inner region of said crucible as initial charge silicon materials.

7. A method for producing silicon single crystal as set forth in claim 5, wherein said silicon granules are supplied into said outer region from plural positions in a circumferential direction of said crucible.

8. A method for producing silicon single crystal using silicon granules, comprising:

preparing powdered silicon;

growing silicon granules by reducing trichlorosilane gas on the surface of said powdered silicon, wherein the growth rate of silicon is set to more than 0.4 m/min so as to have a residual chlorine concentration of 15 wtppm or less; and growing silicon single crystal by pulling a silicon seed crystal from a melt of liquid silicon prepared by melting said silicon granules.

9. A method for producing silicon single crystal as set forth in claim 8, wherein in the step of growing silicon single crystal, said silicon granules are put in a crucible and melted, said silicon seed crystal is brought into contact with said melt of liquid silicon in said crucible, and said silicon single crystal growing at an end of said seed crystal is pulled up together with said seed crystal 10. A method for producing silicon single crystal as set forth in claim 8, wherein in the step of growing silicon single crystal, said silicon granules are supplied in said crucible as additional charge silicon materials.

11. A method for producing silicon single crystal as set forth in claim 10, wherein said silicon granules are supplied in said crucible as initial charge silicon materials.

12. A method for producing silicon single crystal as set forth in claim 8, wherein in the step of growing silicon single crystal, a bulkhead for dividing a crucible into an inner region and an outer region is provided in said crucible in the state that both regions communicate with each other under a surface of said liquid silicon, said silicon seed crystal is brought into contact with said liquid silicon in said inner region, said silicon granules are supplied into said outer region as additional charge silicon materials, and said silicon single crystal growing at an end of said seed crystal is pulled up together with said seed crystal.

13. A method for producing silicon single crystal as set forth in claim 12, wherein said silicon granules are supplied into said inner region of said crucible as initial charge silicon materials.

14. A method for producing silicon single crystal as set forth in claim 12, wherein said silicon granules are supplied into said outer region from plural positions in a circumferential direction of said crucible.

*15. A method for producing silicon single crystal using silicon granules comprising:*

*preparing powdered silicon;*

*growing silicon granules by decomposing silane gas on the surface of said powdered silicon;*

*heating said silicon granules in a heating container to release the hydrogen included in the silicon granules as $H_2$ which is removed therefrom, said heating being carried out until the silicon granules have a residual hydrogen concentration of 7.5 wtppm or less; and*

*growing silicon single crystal by pulling a silicon seed crystal from a melt of liquid silicon prepared by melting said silicon granules.*

*16. The method of claim 15, wherein the $H_2$ is exhausted to outside of said heating container.*

* * * * *